United States Patent
Harayama

(10) Patent No.: US 9,356,610 B1
(45) Date of Patent: May 31, 2016

(54) CLOCK DATA RECOVERY CIRCUIT AND SEMICONDUCTOR DEVICE

(71) Applicant: LAPIS SEMICONDUCTOR CO., LTD., Kanagawa (JP)

(72) Inventor: Kunihiro Harayama, Kanagawa (JP)

(73) Assignee: LAPIS SEMICONDUCTOR CO., LTD., Kanagawa (JP)

( * ) Notice: Subject to any disclaimer, the term of this patent is extended or adjusted under 35 U.S.C. 154(b) by 0 days.

(21) Appl. No.: 14/963,611

(22) Filed: Dec. 9, 2015

(30) Foreign Application Priority Data

Dec. 12, 2014 (JP) .................................. 2014-251484

(51) Int. Cl.
| | | |
|---|---|---|
| *H04L 7/04* | (2006.01) |
| *H03L 7/08* | (2006.01) |
| *H02M 3/07* | (2006.01) |
| *H04L 7/00* | (2006.01) |

(52) U.S. Cl.
CPC .............. *H03L 7/0807* (2013.01); *H02M 3/07* (2013.01); *H04L 7/0016* (2013.01); *H04L 7/04* (2013.01)

(58) Field of Classification Search
CPC ..... H03L 7/0807; H02M 3/07; H04L 7/0016; H04L 7/04
USPC ........................................................ 375/362
See application file for complete search history.

(56) References Cited

U.S. PATENT DOCUMENTS

| | | | | |
|---|---|---|---|---|
| 9,172,526 B1* | 10/2015 | Malipatil | ................ | H04L 7/033 |
| 2010/0264963 A1* | 10/2010 | Kikuchi | ................ | H03K 5/131 |
| | | | | 327/157 |
| 2011/0157120 A1* | 6/2011 | Hasegawa | ............ | G09G 3/3688 |
| | | | | 345/209 |
| 2012/0163519 A1* | 6/2012 | Choudhury | ............. | H04L 7/033 |
| | | | | 375/354 |
| 2013/0210347 A1* | 8/2013 | Ling | ..................... | H04W 4/008 |
| | | | | 455/41.1 |
| 2014/0118040 A1* | 5/2014 | Nakayama | ............ | H03L 7/0816 |
| | | | | 327/157 |
| 2015/0138254 A1* | 5/2015 | Nakayama | ........... | G09G 3/3688 |
| | | | | 345/690 |
| 2015/0207618 A1* | 7/2015 | Tsunoda | ............... | H04L 7/0331 |
| | | | | 375/374 |

FOREIGN PATENT DOCUMENTS

JP 2012-44446 A 3/2012

* cited by examiner

*Primary Examiner* — Daniel Washburn
*Assistant Examiner* — Berhanu Tadese
(74) *Attorney, Agent, or Firm* — Kubotera & Associates, LLC

(57) ABSTRACT

A clock data recovery circuit is configured to receive an input data signal formed of a series of input data pieces synchronized with a reference clock signal, and to generate a regenerated clock signal. The clock data recovery circuit includes a regenerated clock generating circuit; a latch circuit; a comparison circuit; a logical sum signal generating circuit; and a charge pump.

12 Claims, 17 Drawing Sheets

CLOCK DATA RECOVERY CIRCUIT AND SEMICONDUCTOR DEVICE

BACKGROUND OF THE INVENTION AND RELATED ART STATEMENT

The present invention relates to a clock data recovery circuit, a phase synchronization circuit, and a semiconductor device having the clock data recovery circuit.

As a current communication method of high speed serial data, an embedded clock method, in which a clock signal is overlapped with a data signal and is transmitted, has been adopted. When the embedded method is adopted to a reception device of a communication system, the reception device may include a conventional clock data recovery circuit for regenerating the clock signal from the data signal thus received using a synchronization of data transition in the data signal thus received, and for retrieving the data signal thus received at a timing of the clock signal thus regenerated.

Patent Reference has disclosed an example of the conventional clock data recovery circuit. According to Patent Reference, the conventional clock data recovery circuit may be formed of a reception circuit; a latch circuit; a phase comparison circuit; a charge pump; a low pass filter (LPF); a voltage control oscillator (VCO); and the like.

Patent Reference: Japanese Patent Publication No. 2012-44446

In the conventional clock data recovery circuit disclosed in Patent Reference, the latch circuit is formed of a plurality of flip flops (FFs) and the like, and is configured to latch the serial data input through the reception circuit at a timing of a regenerated clock regenerated with the VCO, so that the latch circuit outputs the serial data. The phase comparison circuit is configured to perform a phase comparison according to the output signal of the latch circuit. The charge pump is configured to supply a charge pump voltage having an electron charge amount corresponding to a comparison result to the VCO. The VCO is configured to change an oscillation frequency according to the charge pump voltage, so that the VCO corrects a phase of the regenerated clock. Accordingly, in the conventional clock data recovery circuit disclosed in Patent Reference, it has been proposed to widen a frequency variable range of data while avoiding restriction of timing skew between the clock and the data.

As described above, in the conventional clock data recovery circuit disclosed in Patent Reference, an edge timing is detected when the serial data is transited, so that the retrieving and the phase comparison are performed. Accordingly, unless the input data is transited, the phase comparison is not performed, so that it is difficult to maintain the synchronization.

To this end, a pattern mapping, in which a dummy bit is inserted regularly in the serial data, is performed, so that the data can be transited once per at least a few unit data cycles (UI). In this case, when it is tried to shorten a time of period when the data is not transited, it is necessary to insert the dummy bit at a higher frequency, thereby deteriorating efficiency of data transfer.

On the other hand, when the dummy bit is inserted at a lower frequency to prolong a time of period when the data is not transited, there is a large difference in the number of data transition between when the serial data with a pattern of more frequent data transition is input and when the serial data with a pattern of less frequent data transition is input. As a result, there is a larger difference between a maximum amount and a minimum amount of the electron charge amount to be charged with the charge pump.

In the conventional clock data recovery circuit disclosed in Patent Reference, when the charge pump charges a small amount of the electron charge amount, it is difficult for the clock to follow the pattern change of the data when the charge pump voltage to be supplied to the VCO is changed according to the comparison result of the phase comparison circuit. As a result, it is difficult to synchronize the data with the clock. On the other hand, when the charge pump charges a large amount of the electron charge amount, it is become too sensitive relative to even a slight phase change. As a result, the frequency of the VCO is excessively changed, thereby increasing jitter of the clock. Accordingly, a margin of setting up and holding of the FFs of the latch circuit, thereby making it difficult to accurately retrieve the data.

As described above, in the conventional clock data recovery circuit disclosed in Patent Reference, there is a tradeoff relationship between the following ability of the clock relative to the data and the jitter of the clock. Accordingly, it is difficult to prolong a period of time when the data is not transited.

In view of the problems of the conventional clock data recovery circuit described above, an object of the present invention is to provide a clock data recovery circuit, a phase synchronization circuit, and a semiconductor device capable of improving the follow ability of the clock relative to the data whiling minimizing the jitter of the clock.

Further objects and advantages of the invention will be apparent from the following description of the invention.

SUMMARY OF THE INVENTION

In order to attain the objects described above, according to a first aspect of the present invention, a clock data recovery circuit is configured to receive an input data signal formed of a series of input data pieces synchronized with a reference clock signal, and to generate a regenerated clock signal. The clock data recovery circuit includes a regenerated clock generating circuit; a latch circuit; a comparison circuit; a logical sum signal generating circuit; and a charge pump.

According to the first aspect of the present invention, the regenerated clock generating circuit is configured to generate a plurality of regenerated clock signals having phases different each other by a half of a cycle of the reference clock signal. The latch circuit is configured to sequentially latch the input data signal at an edge timing of the regenerated clock signals, so that the latch circuit generates a plurality of latch data signals.

According to the first aspect of the present invention, the comparison circuit is configured to generate an up signal having a pulse width greater than the cycle of the reference clock signal when n-th one (n is a natural number) of the latch data signals is different from (n+1)th one of the latch data signals among the latch data signals. Further, the comparison circuit is configured to generate a down signal having a pulse width greater than the cycle of the reference clock signal when the (n+1)th one of the latch data signals is different from (n+2)th one of the latch data signals. Accordingly, the comparison circuit is configured to generate a plurality of up signals and a plurality of down signals.

According to the first aspect of the present invention, the logical sum signal generating circuit is configured to generate a first logical sum signal formed of a logical sum of the up signals and a second logical sum signal formed of a logical sum of the down signals. The charge pump is configured to generate a phase control voltage through charging electron charges according to the first logical sum signal, and discharging the electron charges according to the second logical sum signal. Accordingly, the regenerated clock generating circuit is configured to correct phases of the regenerated clock signals according to the phase control voltage.

According to a second aspect of the present invention, a phase synchronization circuit includes a regenerated clock generating circuit; a comparison circuit; a logical sum signal generating circuit; and a charge pump.

According to the second aspect of the present invention, the regenerated clock generating circuit is configured to generate a plurality of regenerated clock signals having phases different each other by a half of a cycle of a reference clock signal according to the reference clock signal. The comparison circuit is configured to generate a plurality of up signals when n-th one (n is a natural number) of the latch data signals is different from (n+1)th one of the latch data signals among the latch data signals. Further, the comparison circuit is configured to generate a plurality of down signals when the (n+1)th one of the latch data signals is different from (n+2)th one of the latch data signals. Accordingly, the comparison circuit is configured to generate a plurality of up signals and a plurality of down signals.

According to the second aspect of the present invention, the logical sum signal generating circuit is configured to generate a first logical sum signal formed of a logical sum of the up signals and a second logical sum signal formed of a logical sum of the down signals. The charge pump is configured to generate a phase control voltage through charging electron charges according to the first logical sum signal, and discharging the electron charges according to the second logical sum signal. Accordingly, the regenerated clock generating circuit is configured to correct phases of the regenerated clock signals according to the phase control voltage.

According to a third aspect of the present invention, a semiconductor device includes a clock data recovery circuit. The clock data recovery circuit is configured to receive an input data signal formed of a series of input data pieces synchronized with a reference clock signal, and to generate a regenerated clock signal. The semiconductor device includes a regenerated clock generating circuit; a latch circuit; a comparison circuit; a logical sum signal generating circuit; and a charge pump.

According to the third aspect of the present invention, the regenerated clock generating circuit is configured to generate a plurality of regenerated clock signals having phases different each other by a half of a cycle of the reference clock signal. The latch circuit is configured to sequentially latch the input data signal at an edge timing of the regenerated clock signals, so that the latch circuit generates a plurality of latch data signals.

According to the third aspect of the present invention, the comparison circuit is configured to generate an up signal having a pulse width greater than the cycle of the reference clock signal when n-th one (n is a natural number) of the latch data signals is different from (n+1)th one of the latch data signals among the latch data signals. Further, the comparison circuit is configured to generate a down signal having a pulse width greater than the cycle of the reference clock signal when the (n+1)th one of the latch data signals is different from (n+2)th one of the latch data signals. Accordingly, the comparison circuit is configured to generate a plurality of up signals and a plurality of down signals.

According to the third aspect of the present invention, the logical sum signal generating circuit is configured to generate a first logical sum signal formed of a logical sum of the up signals and a second logical sum signal formed of a logical sum of the down signals. The charge pump is configured to generate a phase control voltage through charging electron charges according to the first logical sum signal, and discharging the electron charges according to the second logical sum signal. Accordingly, the regenerated clock generating circuit is configured to correct phases of the regenerated clock signals according to the phase control voltage.

According to the present invention, it is possible to improve follow ability of the clock relative to data whiling minimizing jitter of the clock.

DETAILED DESCRIPTION OF PREFERRED EMBODIMENTS

Hereunder, preferred embodiments of the present invention will be explained with reference to the accompanying drawings.

First Embodiment

Figure 1:
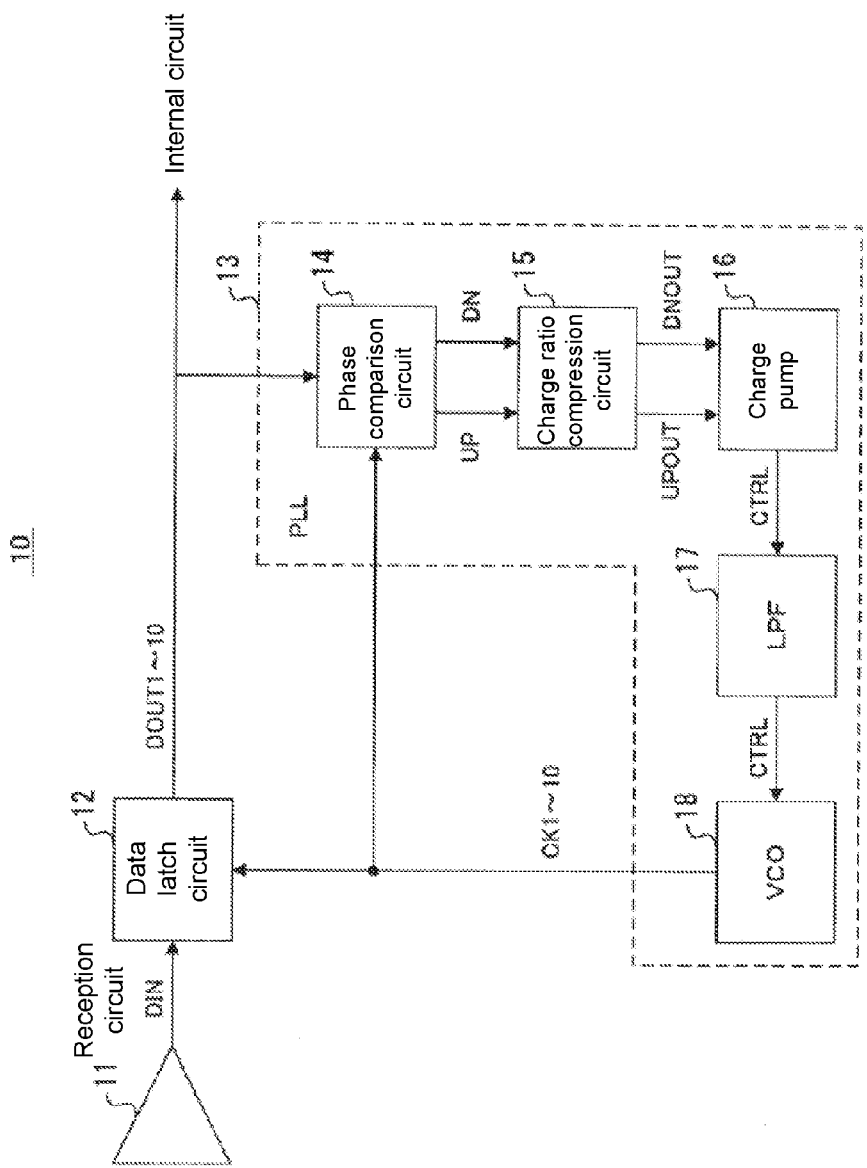
FIG. 1 is a block diagram showing a configuration of a clock data recovery circuit according to a first embodiment of the present invention.

A first embodiment of the present invention will be explained. FIG. 1 is a block diagram showing a configuration of a clock data recovery circuit 10 according to the first embodiment of the present invention.

In the first embodiment, the clock data recovery circuit 10 is formed in a semiconductor IC (Integrated Circuit) mounted on a reception device (not shown). As shown in FIG. 1, the clock data recovery circuit 10 includes a reception circuit 11; a data latch circuit 12; and a PLL (Phase Locked Loop) circuit 13.

In the first embodiment, the reception circuit 11 is configured to generate a received data signal DIN through receiving and amplifying a series of data pieces synchronized with a reference clock signal.

Figure 2:
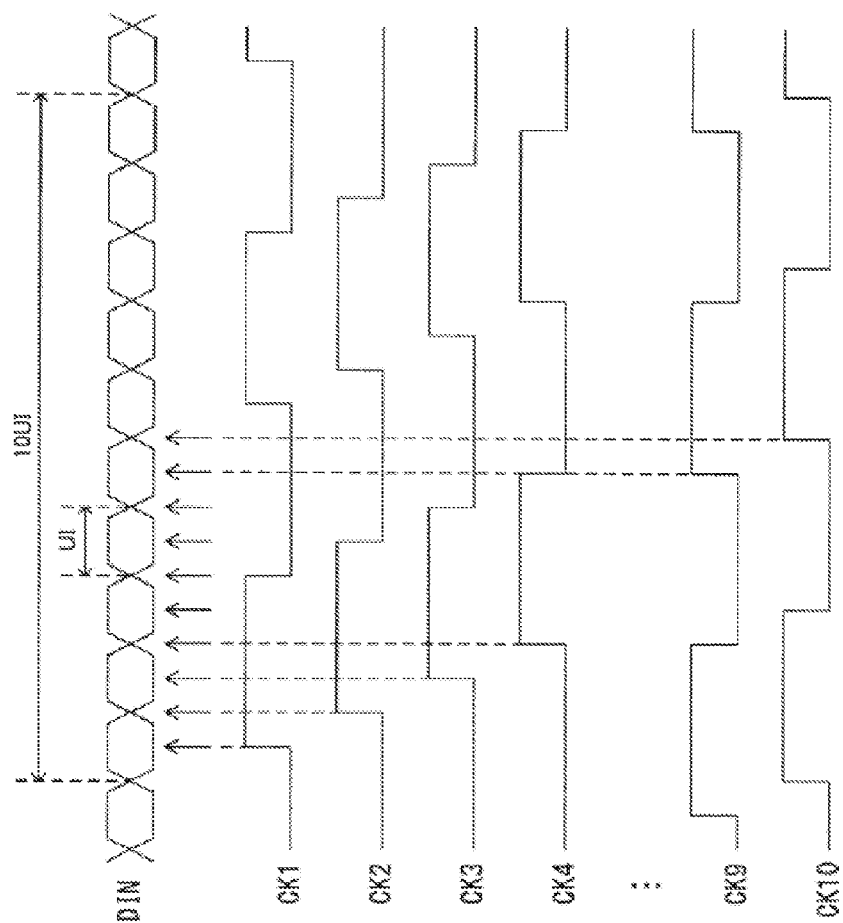
FIG. 2 is a time chart showing a relationship between a received data signal and regenerated clock signals of the clock data recovery circuit according to the first embodiment of the present invention.

FIG. 2 is a time chart showing a relationship between the received data signal DIN and regenerated clock signals CK1 to CK10 of the clock data recovery circuit 10 according to the first embodiment of the present invention. As shown in FIG. 2, the received data signal DIN is a signal formed of a plurality of data bits synchronized with a cycle (referred to as a unit data cycle UI) of the reference clock signal and having a reference transition cycle 10 UI.

Figure 3:
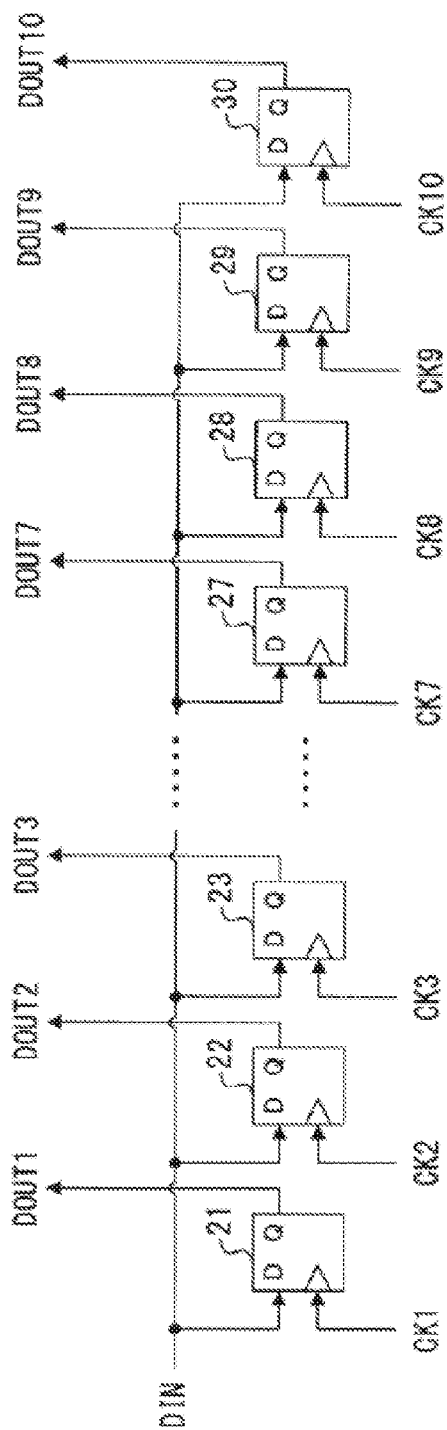
FIG. 3 is a circuit diagram showing a circuitry configuration of a data latch circuit of the clock data recovery circuit according to the first embodiment of the present invention.

In the first embodiment, the data latch circuit 12 is configured to perform a parallel conversion of five bits relative to the received data signal DIN. FIG. 3 is a circuit diagram showing a circuitry configuration of the data latch circuit 12 of the clock data recovery circuit 10 according to the first embodiment of the present invention.

As shown in FIG. 3, the data latch circuit 12 includes FFs (Flip Flops) 21 to 30. The FFs 21 to 30 are configured to latch the received data signal DIN at timings of the regenerated clock signals CK1 to CK10, and to output the received data signal DIN thus latched as latch data signal DOUT1 to DOUT 10, respectively.

As shown in FIG. 1, the clock data recovery circuit 10 further includes a VCO (Voltage Control Oscillator) 18 as a regenerated clock generating circuit. The VCO 18 is configured to generate the regenerated clock signals CK1 to CK10.

As shown in FIG. 2, the regenerated clock signals CK1 to CK10 have phases different with each other by 0.5 UI.

In the first embodiment, as shown in FIG. 2, when the phase of the received data signal DIN is synchronized with the phases of the regenerated clock signals CK1 to CK10, the regenerated clock signals CK1, CK3, CK5, CK7, and CK9 become signals rising at the middle of the unit data cycle UI. Further, the regenerated clock signals CK2, CK4, CK6, CK8, and CK10 become signals rising at a timing of an edge of the unit data cycle UI.

Figure 4:
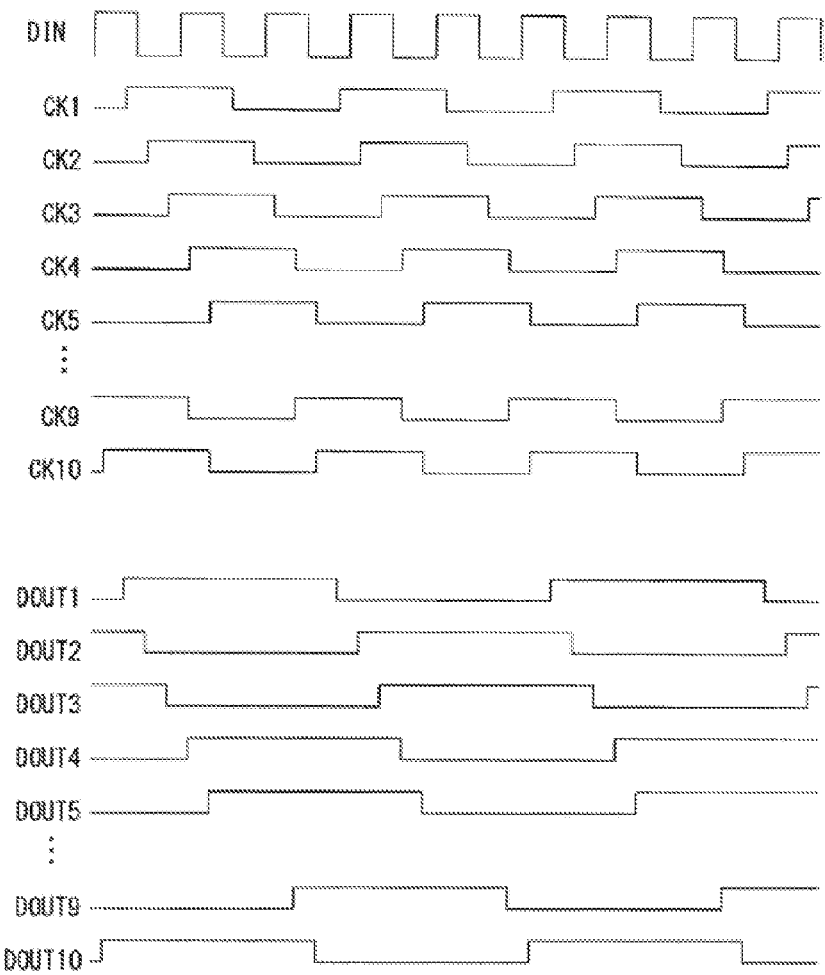
FIG. 4 is a time chart showing latch data signals of the clock data recovery circuit when a phase of the received data signal is delayed relative to that of a regenerated clock according to the first embodiment of the present invention.

FIG. 4 is a time chart showing the regenerated clock signals CK1 to CK10 and the latch data signals DOUT1 to DOUT10 of the clock data recovery circuit 10 when the phase of the regenerated clock signal is delayed relative to that of the received data signal DIN according to the first embodiment of the present invention.

As shown in FIG. 4, the latch data signal DOUT1 is a signal latched at the timing of the regenerated clock signal CK1, and the latch data signal DOUT2 is a signal latched at the timing of the regenerated clock signal CK2 that has the phase delayed from the regenerated clock signal CK1 by 0.5 UI. That is, the latch data signal DOUT1 is latched at the timing delayed from that of the latch data signal DOUT2 by 0.5 UI. More specifically, the latch data signal DOUT1 is a signal latched at the middle of the unit data cycle UI, and the latch data signal DOUT2 is a signal latched at the timing of the edge of the unit data cycle UI. Accordingly, the latch data signal DOUT1 and the latch data signal DOUT2 have the phases different with each other by 0.5 UI, and signal levels inverted with each other.

On the other hand, although the latch data signal DOUT2 and the latch data signal DOUT3 have the phases different with each other by 0.5 UI, the latch data signal DOUT2 and the latch data signal DOUT3 do not have the signal levels inverted with each other. Further, the latch data signal DOUT3 and the latch data signal DOUT4 have the phases different with each other by 0.5 UI, and the signal levels inverted with each other. Similarly, the latch data signal DOUT4 and the latch data signal DOUT5 have the phases different with each other by 0.5 UI, but do not have the signal levels inverted with each other. Accordingly, n-th one of the latch data signals and (n+1)th one of the latch data signals have the phases different with each other by 0.5 UI, and the signal levels inverted with each other. Further, (n+1)th one of the latch data signals and (n+2)th one of the latch data signals have the phases different with each other by 0.5 UI.

Figure 5:
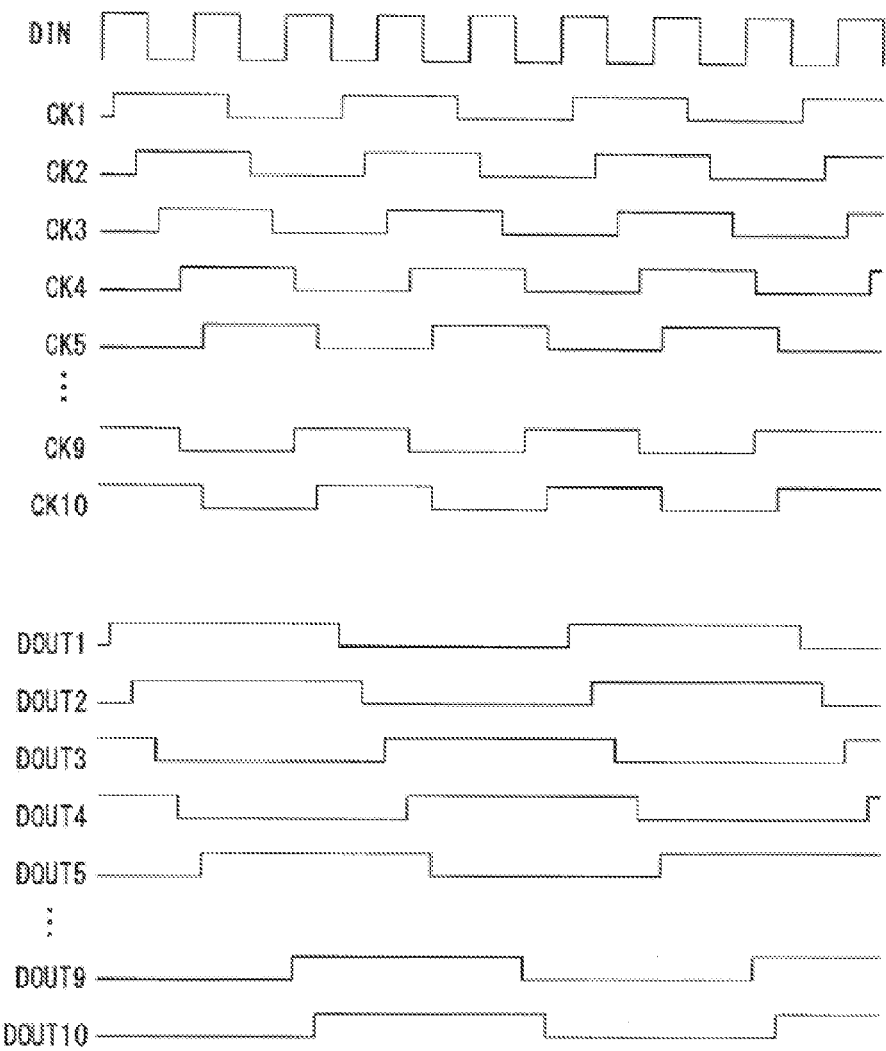
FIG. 5 is a time chart showing the latch data signals of the clock data recovery circuit when the phase of the received data signal is advanced relative to that of the regenerated clock according to the first embodiment of the present invention.

FIG. 5 is a time chart showing the latch data signals to DOUT10 DOUT1 of the clock data recovery circuit when the phase of the regenerated clock signal is advanced relative to that of the received data signal DIN according to the first embodiment of the present invention.

As shown in FIG. 5, the latch data signal DOUT1 and the latch data signal DOUT2 have the phases different with each other by 0.5 UI. Further, the latch data signal DOUT2 and the latch data signal DOUT3 have the phases different with each other by 0.5 UI, and the signal levels inverted with each other. Similarly, the latch data signal DOUT3 and the latch data signal DOUT4 have the phases different with each other by 0.5 UI. Further, the latch data signal DOUT4 and the latch data signal DOUT5 have the phases different with each other by 0.5 UI, and the signal levels inverted with each other. Accordingly, n-th one of the latch data signals and (n+1)th one of the latch data signals have the phases different with each other by 0.5 UI. Further, (n+1)th one of the latch data signals and (n+2)th one of the latch data signals have the phases different with each other by 0.5 UI, and the signal levels inverted with each other.

In the first embodiment, as shown in FIG. 1, the PLL (Phase Locked Loop) circuit 13 is a phase synchronization circuit including a phase comparison circuit 14; a charge ratio compression circuit 15; a charge pump 16; an LPF (Low Pass Filter) 17; and the VCO (Voltage Control Oscillator) 18.

Figure 6:
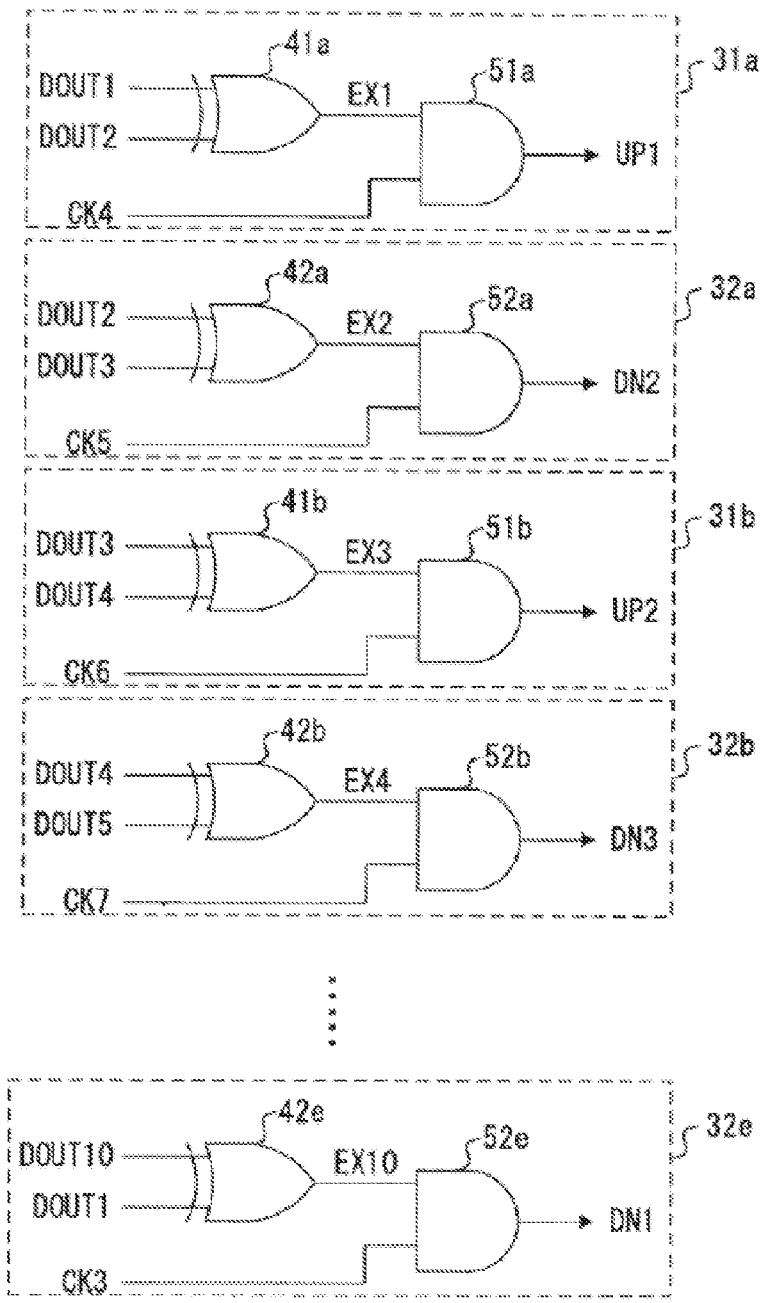
FIG. 6 is a circuit diagram showing a circuitry configuration of a phase comparison circuit of the clock data recovery circuit according to the first embodiment of the present invention.

FIG. 6 is a circuit diagram showing a circuitry configuration of the phase comparison circuit 14 of the clock data recovery circuit 10 according to the first embodiment of the present invention.

As shown in FIG. 6, the phase comparison circuit 14 includes up signal generating circuits 31a to 31e and down signal generating circuits 32a to 32e. The up signal generating circuits 31a to 31e include EXOR circuits 41a to 41e and AND circuits 51a to 51e. The down signal generating circuits 32a to 32e include EXOR circuits 42a to 42e and AND circuits 52a to 52e.

In the first embodiment, the EXOR circuits 41a to 41e and the EXOR circuits 42a to 42e are configured to generate exclusive logical sum signals EX1 to EX10 as exclusive logical sums of adjacent signals among the latch data signals DOUT1 to DOUT10 (except the logical sum of the latch data signal DOUT10 and the latch data signal DOUT1) output from the data latch circuit 12. Then, the EXOR circuits 41a to 41e and the EXOR circuits 42a to 42e are configured to supply the exclusive logical sum signals EX1 to EX10 to the AND circuits 51a to 51e and the AND circuits 52a to 52e, respectively.

More specifically, the EXOR circuits 41a to 41e of the up signal generating circuits 31a to 31e are configured to supply the exclusive logical sum of the n-th one of the latch data signals and the (n+1)th one of the latch data signals to the AND circuits 51a to 51e. Further, the EXOR circuits 42a to 42e of the down signal generating circuits 32a to 32e are configured to supply the exclusive logical sum of the (n+1)th one of the latch data signals and the (n+2)th one of the latch data signals to the AND circuits 52a to 52e.

In the first embodiment, the AND circuits 51a to 51e are configured to generate logical conjunctions of the exclusive logical sum signals EX1, EX3, EX5, EX7, and EX9 and the regenerated clock signals CK4, CK6, CK8, CK10, and CK2 as up signals UP1 to UP5. More specifically, the up signal generating circuits 31a to 31e are configured to generate the logical conjunction of the exclusive logical sum of the n-th one of the latch data signals and the (n+1)th one of the latch data signals and the (n+3)th one of the regenerated clock signals as the up signals UP1 to UP5.

In the first embodiment, the AND circuits 52a to 52e are configured to generate logical conjunctions of the exclusive logical sum signals EX2, EX4, EX6, EX8, and EX10 and the regenerated clock signals CK5, CK7, CK9, CK1, and CK3 as down signals DN1 to DN5. More specifically, the up signal generating circuits 32a to 32e are configured to generate the logical conjunction of the exclusive logical sum of the (n+1)th one of the latch data signals and the (n+2)th one of the latch data signals and the (n+4)th one of the regenerated clock signals as the down signals DN1 to DN5.

Accordingly, in the first embodiment, when the exclusive logical sum signals EX1 to EX10 have the logical level of one (1), the up signals UP1 to UP5 and the down signals DN1 to DN5 become signals having a pulse width (2.5 UI) the same as that of the regenerated clock signal. On the other hand, when the exclusive logical sum signals EX1 to EX10 have the logical level of zero (0), the up signals UP1 to UP5 and the down signals DN1 to DN5 have the logical level of zero (0).

Through the operation described above, in the first embodiment, when the n-th one (n is a natural number) of the latch data signals is different from the (n+1)th one of the latch data signals, the up signal generating circuits 31a to 31e generate the up signals UP1 to UP5. Further, when the (n+1)th one of the latch data signals is different from the (n+2)th one of the latch data signals, the down signal generating circuits 32a to 32e generate the down signals DN1 to DN5.

Figure 7:
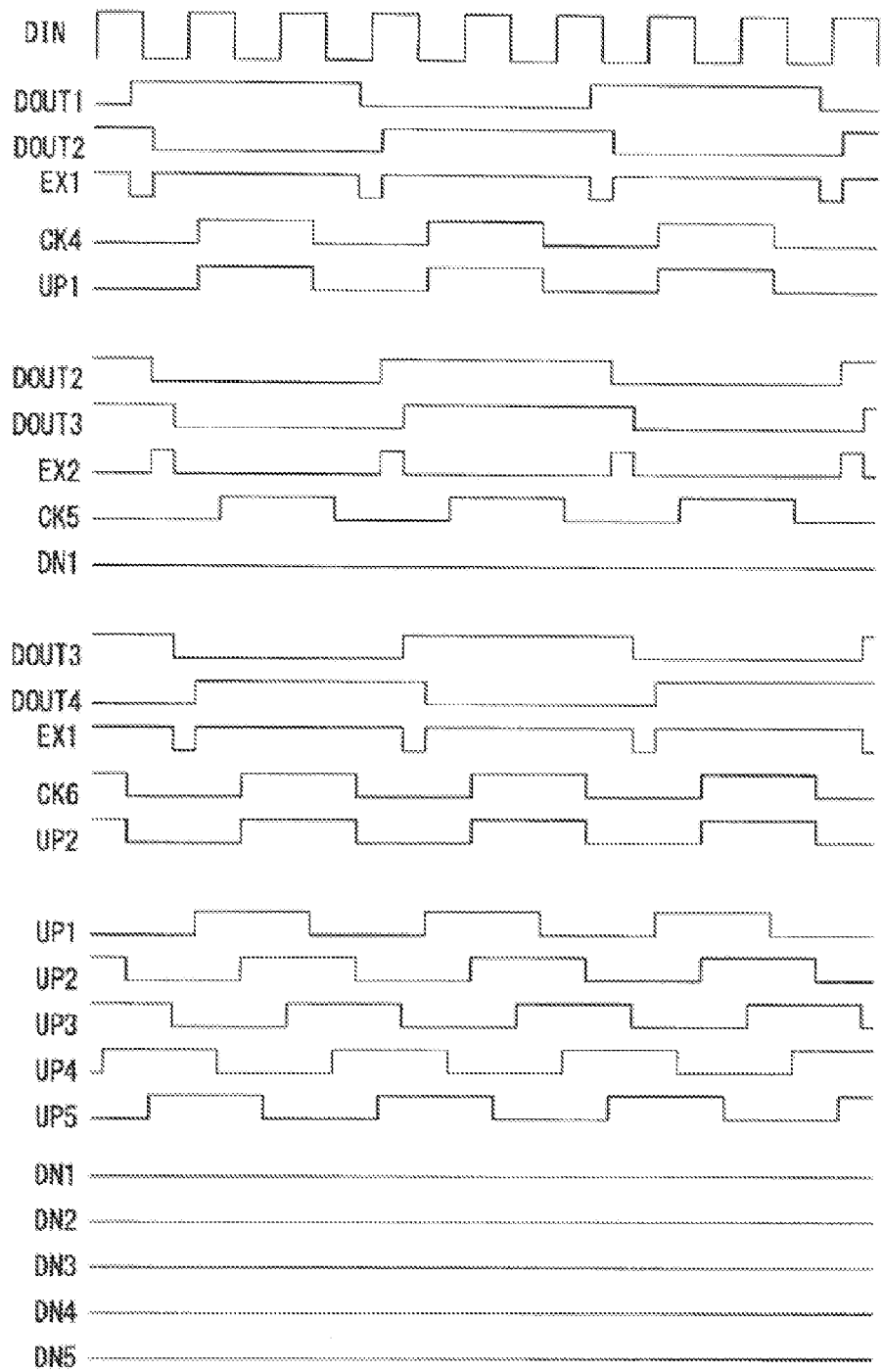
FIG. 7 is a time chart showing up signals and down signals generated with the phase comparison circuit of the clock data recovery circuit when the phase of the received data signal is delayed relative to that of a clock signal according to the first embodiment of the present invention.

FIG. 7 is a time chart showing the up signals and the down signals generated with the phase comparison circuit 14 of the clock data recovery circuit 10 when the phase of the received data signal DIN is delayed relative to that of the clock signal according to the first embodiment of the present invention.

As shown in FIG. 7, the latch data signal DOUT1 has the phase different from that of the latch data signal DOUT2 by 0.5 UI, and has the signal level inverted from that of the latch data signal DOUT2. Accordingly, the exclusive logical sum signal EX1 becomes a signal having the logical level of one (1) over an almost entire period of time. Accordingly, the up signal generating circuit 31a generates the up signal UP1 having the pulse width the same as that of the regenerated clock signal CK4.

Further, the latch data signal DOUT3 has the phase different from that of the latch data signal DOUT2 by 0.5 UI. Accordingly, the exclusive logical sum signal EX2 becomes a signal having the logical level of zero (0) over an almost entire period of time. Accordingly, the down signal generating circuit 32a generates the down signal DN1 having the logical level of zero (0).

Similarly, in the first embodiment, the up signal generating circuits 31b to 31e generate the up signals UP2 to UP5 having the pulse width of 2.5 UI. Further, the down signal generating circuits 32b to 32e generate the down signals DN2 to DN5 having the logical level of zero (0).

Figure 8:
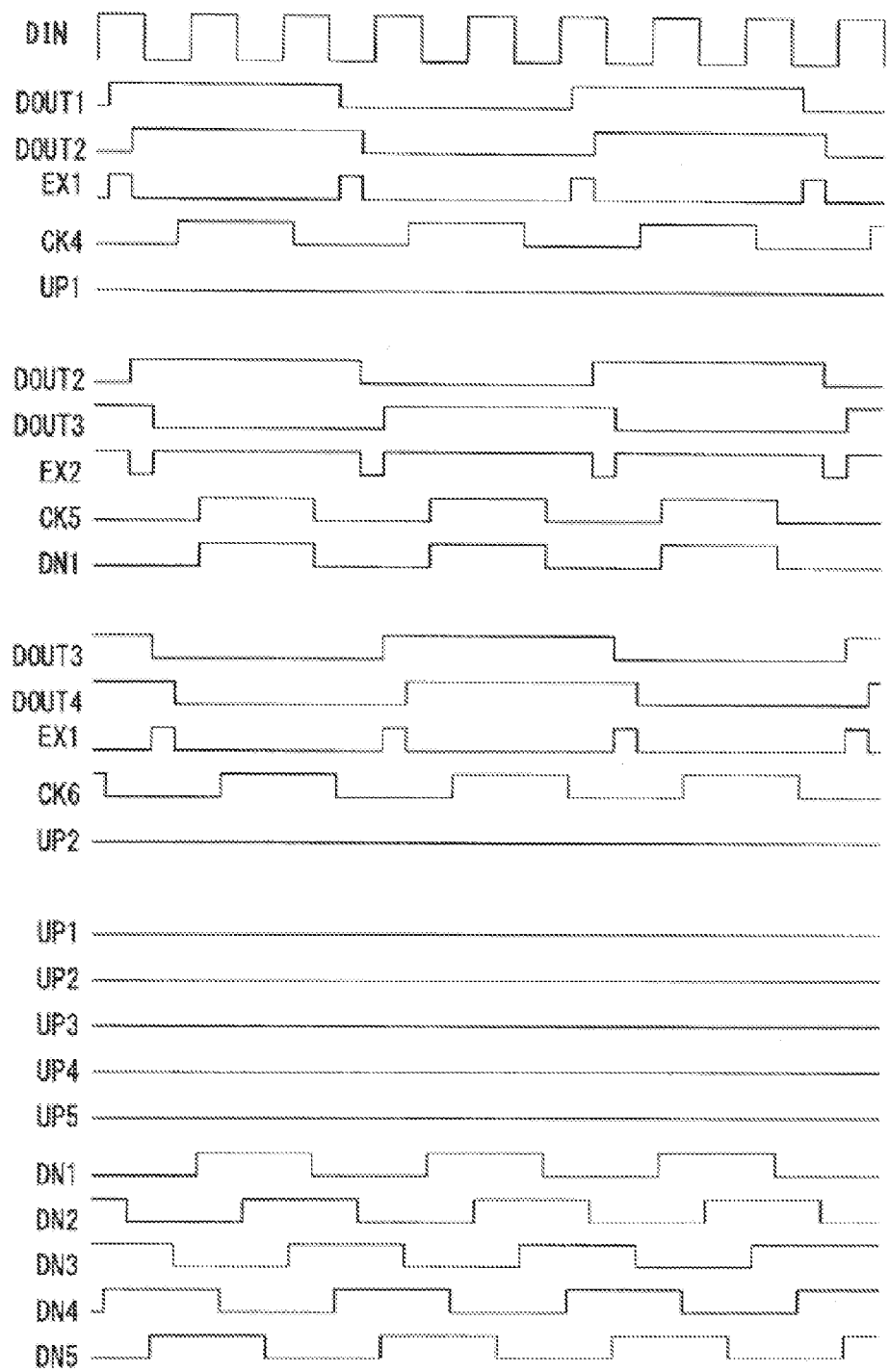
FIG. 8 is a time chart showing the up signals and the down signals generated with the phase comparison circuit of the clock data recovery circuit when the phase of the received data signal is advanced relative to that of the clock signal according to the first embodiment of the present invention.

FIG. 8 is a time chart showing the up signals and the down signals generated with the phase comparison circuit 14 of the clock data recovery circuit 10 when the phase of the received data signal DIN is advanced relative to that of the clock signal according to the first embodiment of the present invention.

As shown in FIG. 8, the latch data signal DOUT1 has the phase different from that of the latch data signal DOUT2 by 0.5 UI. Accordingly, the exclusive logical sum signal EX1 becomes a signal having the logical level of zero (0) over an almost entire period of time. Accordingly, the up signal generating circuit 31a generates the up signal UP1 having the logical level of zero (0).

Further, the latch data signal DOUT3 has the phase different from that of the latch data signal DOUT2 by 0.5 UI, and has the signal level inverted from that of the latch data signal DOUT2. Accordingly, the exclusive logical sum signal EX2 becomes a signal having the logical level of one (1) over an almost entire period of time. Accordingly, the down signal generating circuit 32a generates the down signal DN1 having the pulse width the same as that of the regenerated clock signal CK5.

Similarly, in the first embodiment, the up signal generating circuits 31b to 31e generate the up signals UP2 to UP5 having the logical level of zero (0). Further, the down signal generating circuits 32b to 32e generate the down signals DN2 to DN5 having the pulse width of 2.5 UI. Through the operation described above, the phase comparison circuit 14 obtains the up signals UP1 to UP5 and the down signals DN1 to DN5.

Figure 9:
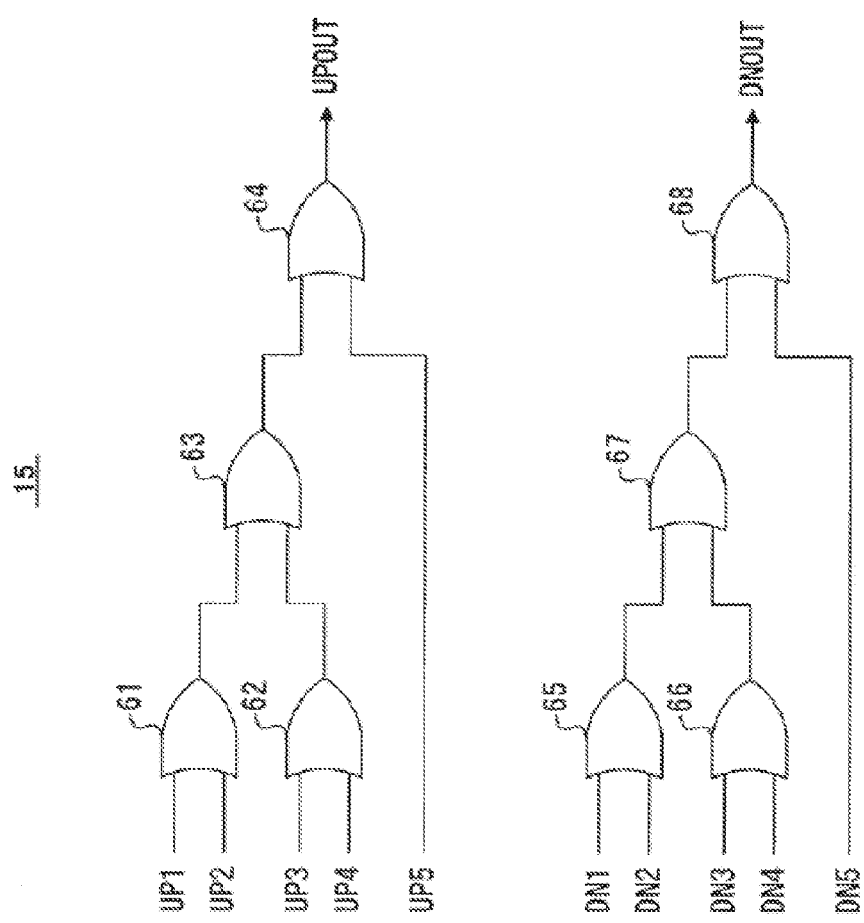
FIG. 9 is a circuit diagram showing a circuitry configuration of a charge ratio compression circuit of the clock data recovery circuit according to the first embodiment of the present invention.

FIG. 9 is a circuit diagram showing a circuitry configuration of the charge ratio compression circuit 15 of the clock data recovery circuit 10 according to the first embodiment of the present invention.

As shown in FIG. 9, the charge ratio compression circuit 15 includes OR circuits 61 to 68, and is configured to be a logical sum signal generating circuit for generating a signal formed of logical sums of input signals. More specifically, the charge ratio compression circuit 15 is configured to the logical sums of the up signals UP1 to UP5 as an up logical sum signal UPOUT. When one of the up signals UP1 to UP5 has the logical level of one (1), the up logical sum signal UPOUT has the logical level of one (1). When all of the up signals UP1 to UP5 have the logical level of zero (0), the up logical sum signal UPOUT has the logical level of zero (0).

Figure 10:
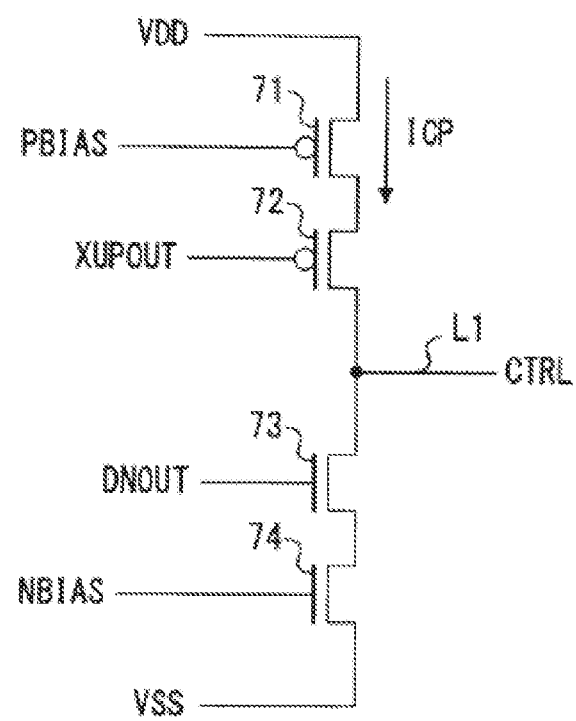
FIG. 10 is a circuit diagram showing a circuitry configuration of a charge pump of the clock data recovery circuit according to the first embodiment of the present invention.

FIG. 10 is a circuit diagram showing a circuitry configuration of the charge pump 16 of the clock data recovery circuit 10 according to the first embodiment of the present invention.

As shown in FIG. 10, the charge pump 16 includes a transistor 71 and a transistor 72 as P-channel MOS (Metal Oxide Semiconductor) transistors, and a transistor 73 and a transistor 74 as N-channel MOS (Metal Oxide Semiconductor) transistors. The transistor 71 is configured to turn on when the transistor 71 receives a P-bias voltage as a fixed bias. The transistor 74 is configured to turn on when the transistor 74 receives an N-bias voltage as a fixed bias.

In the first embodiment, a signal XUPOUT having an opposite phase to that of the up logical sum signal UPOUT is supplied to a gate of the transistor 72. A constant electrical current ICP is supplied to the charge pump 16 from a constant electrical current source (not shown). When the up logical sum signal UPOUT has the logical level of one (1), that is, the signal XUPOUT having the opposite phase thereto has the logical level of zero (0), the transistor 72 is turned on, so that an electrical charge amount equal to a product of the pulse width and the constant electrical current ICP (the please width×ICP) is charged to a line L1.

In the first embodiment, the down logical sum signal DNOUT is supplied to a gate of the transistor 73. When the down logical sum signal DNOUT has the logical level of one (1), the transistor 73 is turned on, so that an electrical charge amount equal to a product of the pulse width and the constant electrical current ICP (the please width×ICP) is discharged to the line L1.

Through the operation described above, the charge pump 16 is configured to output the comparison result of the phase comparison circuit 14 as a charge pump voltage CTRL. The charge pump voltage CTRL is a phase control signal for controlling correction of the phases of the regenerated clock signals CK1 to CK10 of the VCO (Voltage Control Oscillator) 18.

In the first embodiment, the LPF (Low Pass Filter) 17 is configured to filter the charge pump voltage CTRL output from the charge pump 16, and supplies the charge pump voltage CTRL to the VCO (Voltage Control Oscillator) 18.

In the first embodiment, the VCO (Voltage Control Oscillator) 18 is a regenerated clock signal generating circuit configured to generate the regenerated clock signals CK1 to CK10, and to supply the regenerated clock signals CK1 to CK10 to the data latch circuit 12 and the phase comparison circuit 14. Further, the VCO (Voltage Control Oscillator) 18 is configured to change the oscillation frequency according to the charge pump voltage CTRL supplied from the charge pump 16 through the LPF (Low Pass Filter) 17, so that the VCO (Voltage Control Oscillator) 18 corrects the phases of the regenerated clock signals CK1 to CK10.

A charging operation of the clock data recovery circuit 10 will be explained next. In the following description, the charging operation of the clock data recovery circuit 10 will be explained in two separate cases when the received data signal DIN has a data pattern in which the received data signal DIN is transited ten times during the reference transition cycle 10 UI, and when the received data signal DIN has a data pattern in which the received data signal DIN is transited once during the reference transition cycle 10 UI.

Figure 11:
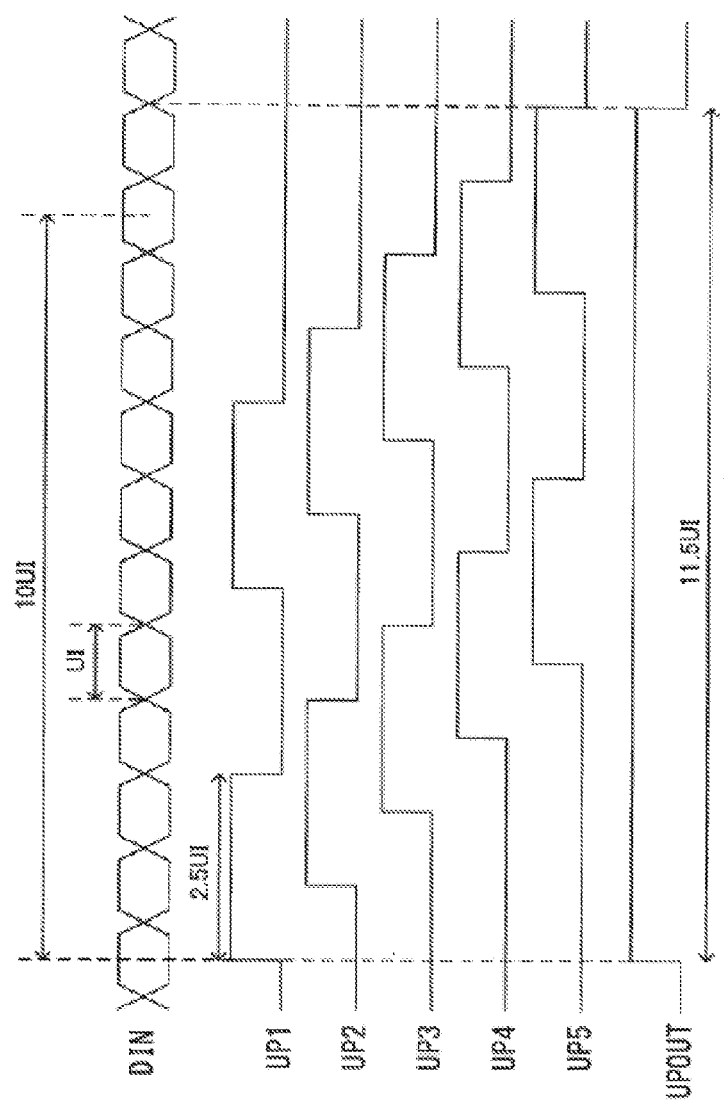
FIG. 11 is a time chart showing a charging operation of the clock data recovery circuit when the received data signal has a pattern in which the received data signal is transited ten times during a reference transition cycle 10 UI according to the first embodiment of the present invention.

FIG. 11 is a time chart showing the charging operation of the clock data recovery circuit 10 when the received data signal DIN has the pattern in which the received data signal DIN is transited ten times during the reference transition cycle 10 UI according to the first embodiment of the present invention.

As shown in FIG. 11, the up signals UP1 to UP5 output from the phase comparison circuit 14 have the pulse width of 2.5 UI, and have the phases different with each other by 1.0 UI.

In the first embodiment, as described above, the charge ratio compression circuit 15 outputs the logical sum of the up signals UP1 to UP5 as the up logical sum signal UPOUT. Accordingly, the up logical sum signal UPOUT has the pulse width of 11.5 UI. Further, the charge pump 16 charges the electrical charge amount of the product of the pulse width of the up logical sum signal UPOUT and the constant electrical current ICP (the please width 11.5 UI×ICP) to the line L1.

Figure 12:
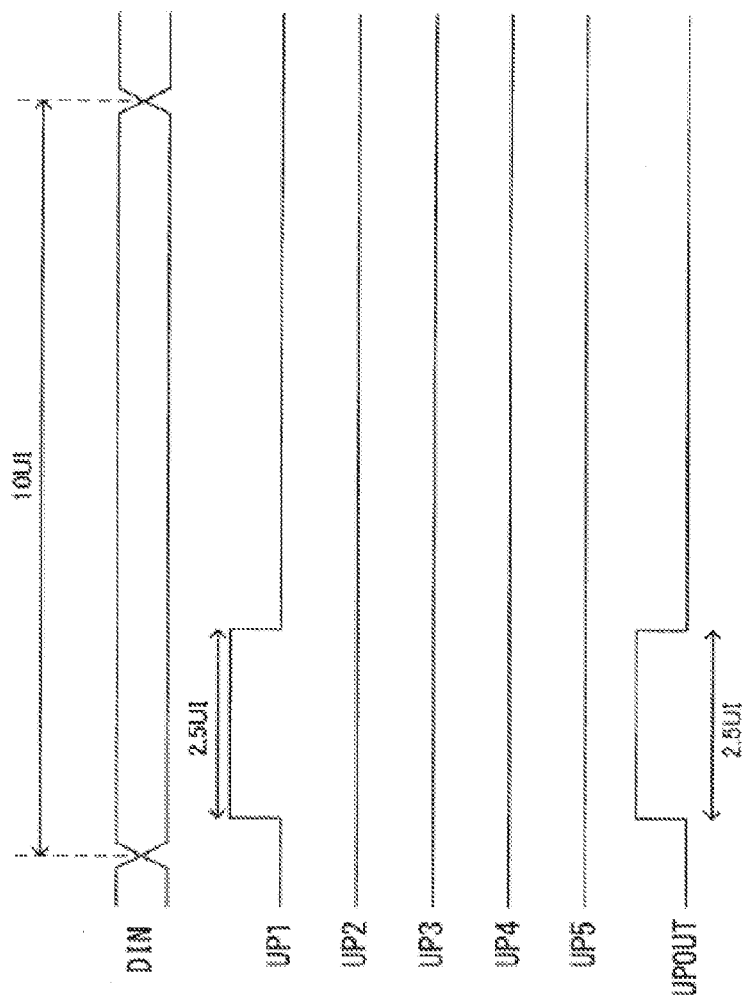
FIG. 12 is a time chart showing the charging operation of the clock data recovery circuit when the received data signal has a pattern in which the received data signal is transited one time during the reference transition cycle 10 UI according to the first embodiment of the present invention.

FIG. 12 is a time chart showing the charging operation of the clock data recovery circuit 10 when the received data signal DIN has the pattern in which the received data signal DIN is transited one time during the reference transition cycle 10 UI according to the first embodiment of the present invention.

As shown in FIG. 12, the up signal UP1 has the pulse width of 2.5 UI, and the up signals UP2 to UP5 have the logical level of zero (0).

In the first embodiment, as described above, the charge ratio compression circuit 15 outputs the logical sum of the up signals UP1 to UP5 as the up logical sum signal UPOUT having the pulse width of 2.5 UI. Accordingly, the charge pump 16 charges the electrical charge amount of the product of the pulse width of the up logical sum signal UPOUT and the constant electrical current ICP (the please width 2.5 UI×ICP) to the line L1.

As described above, the charge pump 16 charges the electrical charge amount at a ratio of 4.6:1.0(11.5:2.5) between the two separate cases when the received data signal DIN is transited ten times during the reference transition cycle 10 UI, and when the received data signal DIN is transited once during the reference transition cycle 10 UI.

Figure 13:
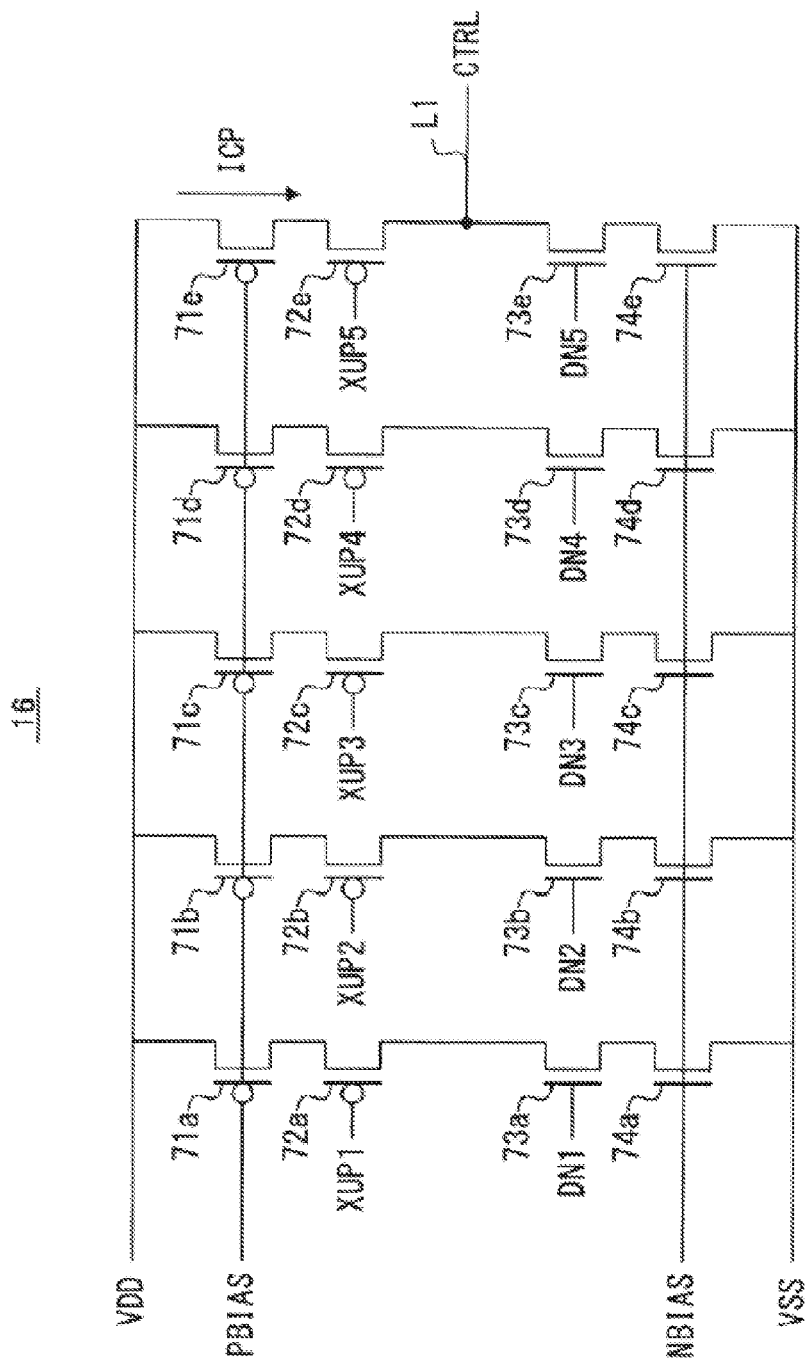
FIG. 13 is a circuit diagram showing a circuitry configuration of the charge pump of the clock data recovery circuit when the clock data recovery circuit does not include the charge ratio compression circuit according to a comparative example.

As a comparative example, a case that the clock data recovery circuit 10 does not include the charge ratio compression circuit 15 will be explained next. FIG. 13 is a circuit diagram showing a circuitry configuration of the charge pump 15 of the clock data recovery circuit 10 when the clock data recovery circuit 10 does not include the charge ratio compression circuit 15 according to the comparative example.

As shown in FIG. 13, when the clock data recovery circuit 10 does not include the charge ratio compression circuit 15, the charge pump 16 includes transistors 72a to 72e. In this case, signals having phases opposite to those of the up signals UP1 to UP5 are supplied to gates, so that the charge pump 16 charges the electrical charge amount equal to the product of the pulse width and the constant electrical current ICP (the please width×ICP) to the line L1.

Figure 14:
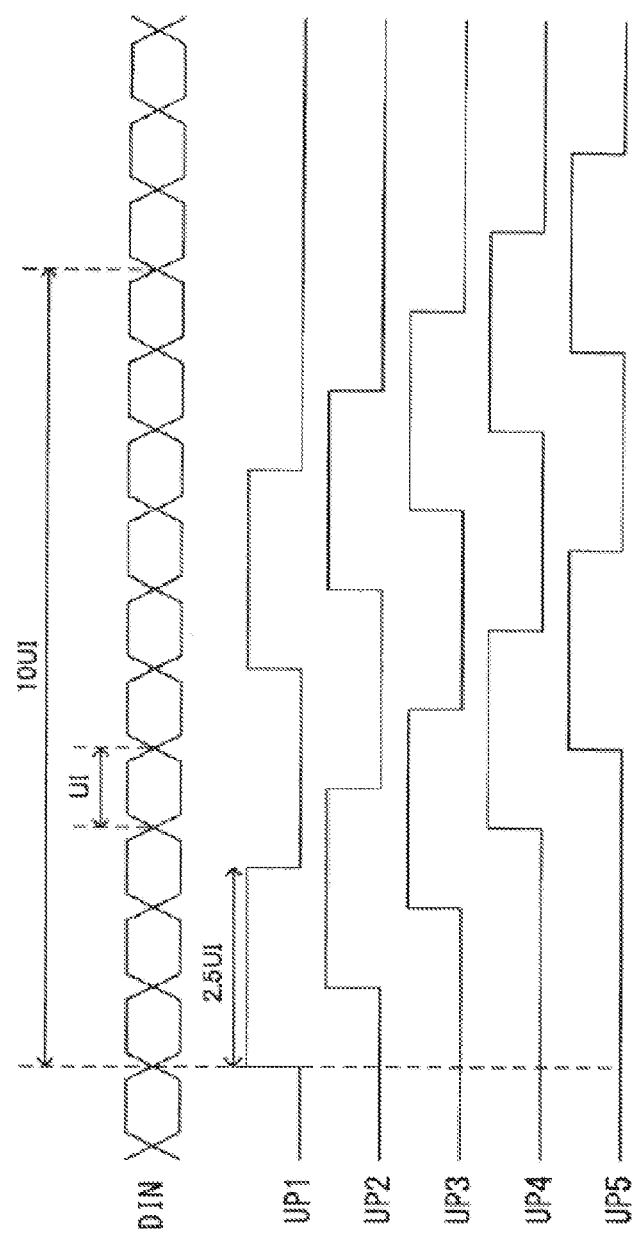
FIG. 14 is a time chart showing an operation of the clock data recovery circuit when the clock data recovery circuit does not include the charge ratio compression circuit according to the comparative example.

FIG. 14 is a time chart showing an operation of the clock data recovery circuit 10 when the clock data recovery circuit 10 does not include the charge ratio compression circuit 15 according to the comparative example.

As shown in FIG. 14, when the received data signal DIN has the data pattern in which the received data signal DIN is transited ten times during the reference transition cycle 10 UI, the charge pump 16 charges the electrical charge amount of the product of the pulse width and the constant electrical current ICP (the please width 10×2.5 UI×ICP=25×ICP) to the line L1.

On the other hand, when the received data signal DIN has the data pattern in which the received data signal DIN is transited one time during the reference transition cycle 10 UI, the charge pump 16 charges the electrical charge amount of the product of the pulse width and the constant electrical current ICP (the please width 2.5 UI×ICP) to the line L1. Accordingly, the charge pump 16 charges the electrical charge amount at a ratio of 10:1 between the two separate cases when the received data signal DIN is transited ten times during the reference transition cycle 10 UI, and when the received data signal DIN is transited once during the reference transition cycle 10 UI.

As described above, in the first embodiment, the clock data recovery circuit 10 includes the charge ratio compression circuit 15. Accordingly, as compared with the case that the clock data recovery circuit 10 does not include the charge ratio compression circuit 15, it is possible to minimize the difference in the electrical charge amounts to be charged between the two separate cases when the transition frequency is maximum and when the transition frequency is minimum.

In the above description, the charging operation of the clock data recovery circuit 10 is explained. It should be noted that the discharging operation of the clock data recovery circuit 10 is similar to the charging operation of the clock data recovery circuit 10. More specifically, when the received data signal DIN has the data pattern in which the received data signal DIN is transited ten times during the reference transition cycle 10 UI, the charge pump 16 discharges the electrical charge amount of the product of the pulse width of the down logical sum signal DNOUT and the constant electrical current ICP (11.5 UI×ICP) to the line L1.

On the other hand, when the received data signal DIN has the data pattern in which the received data signal DIN is transited one time during the reference transition cycle 10 UI, the charge pump 16 discharges the electrical charge amount of the product of the pulse width of the down logical sum signal DNOUT and the constant electrical current ICP (the please width 2.5 UI×ICP) to the line L1. Accordingly, the charge pump 16 charges the electrical charge amount at a ratio of 4.6:1 (11.5:2.5) between the two separate cases when the received data signal DIN is transited ten times during the reference transition cycle 10 UI, and when the received data signal DIN is transited once during the reference transition cycle 10 UI.

As described above, in the first embodiment, the clock data recovery circuit 10 includes the charge ratio compression circuit 15. Accordingly, as compared with the case that the clock data recovery circuit 10 does not include the charge ratio compression circuit 15, it is possible to minimize the difference in the electrical charge amounts to be discharged between the two separate cases when the transition frequency is maximum and when the transition frequency is minimum.

Second Embodiment

A second embodiment of the present invention will be explained next. In the second embodiment, the phase comparison circuit 14 of the clock data recovery circuit 10 has a configuration different from that of the phase comparison circuit 14 of the clock data recovery circuit 10 in the first embodiment.

Figure 15:
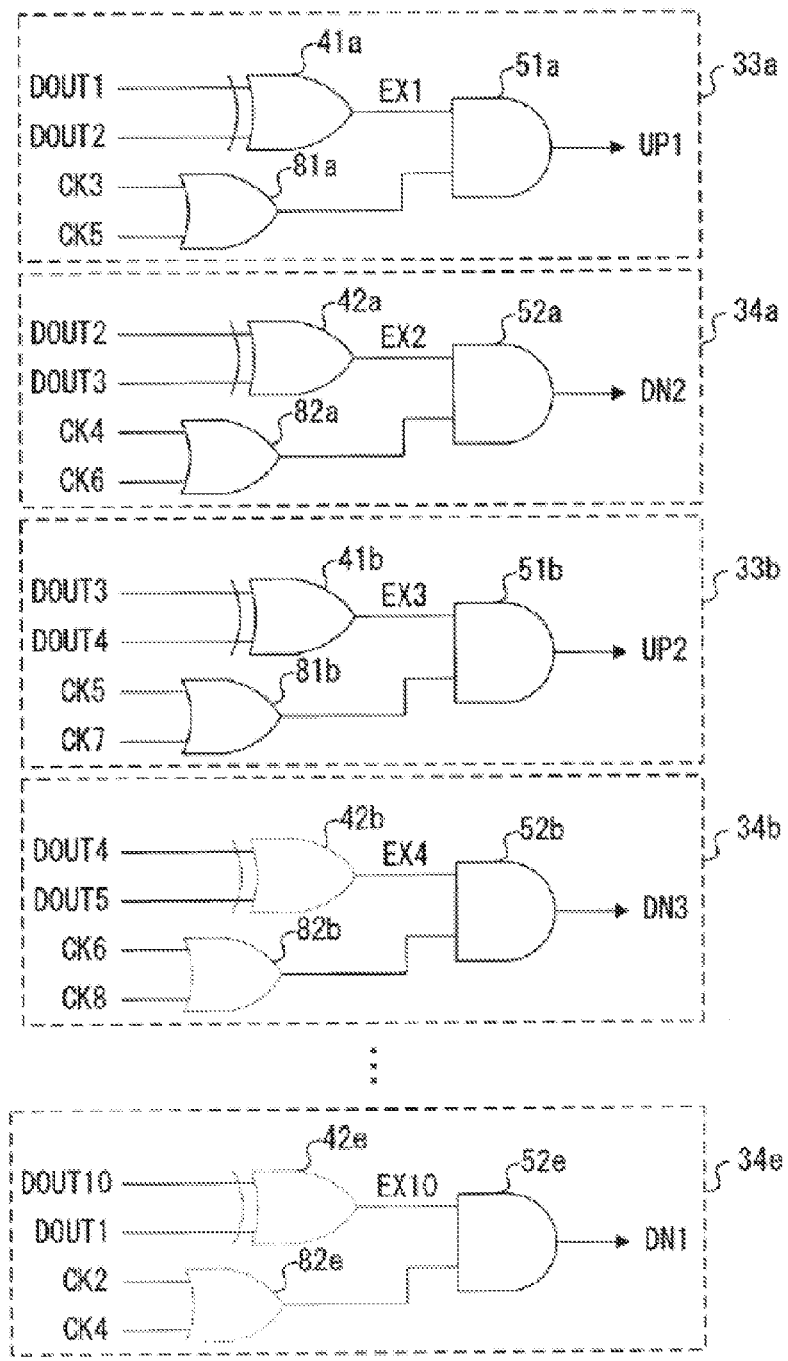
FIG. 15 is a circuit diagram showing a circuitry configuration of a phase comparison circuit of a clock data recovery circuit according to a second embodiment of the present invention.

FIG. 15 is a circuit diagram showing a circuitry configuration of the phase comparison circuit 14 of the clock data recovery circuit 10 according to the second embodiment of the present invention.

As shown in FIG. 15, the phase comparison circuit 14 includes up signal generating circuits 33a to 33e and down signal generating circuits 34a to 34e. The up signal generating circuits 33a to 33e include the EXOR circuits 41a to 41e, the AND circuits 51a to 51e, and OR circuits 81a to 81e. The down signal generating circuits 32a to 32e include the EXOR circuits 42a to 42e, the AND circuits 52a to 52e, and OR circuits 82a to 82e.

In the second embodiment, the EXOR circuits 41a to 41e and the EXOR circuits 42a to 42e are configured to generate the exclusive logical sum signals EX1 to EX10 as the exclusive logical sums of adjacent signals among the latch data signals DOUT1 to DOUT10 (except the logical sum of the latch data signal DOUT10 and the latch data signal DOUT1) output from the data latch circuit 12. Then, the EXOR circuits 41a to 41e and the EXOR circuits 42a to 42e are configured to supply the exclusive logical sum signals EX1 to EX10 to the AND circuits 51a to 51e and the AND circuits 52a to 52e, respectively.

More specifically, the EXOR circuits 41a to 41e of the up signal generating circuits 33a to 33e are configured to supply the exclusive logical sum of the n-th one of the latch data signals and the (n+1)th one of the latch data signals to the AND circuits 51a to 51e. Further, the EXOR circuits 42a to 42e of the down signal generating circuits 34a to 34e are configured to supply the exclusive logical sum of the (n+1)th one of the latch data signals and the (n+2)th one of the latch data signals to the AND circuits 52a to 52e.

In the second embodiment, the OR circuits 81a to 81e of the up signal generating circuits 33a to 33e are configured to supply logical sums of the regenerated clock signals having different cycles with each other by 1 UI (the regenerated clock signals CK3 and CK5, the regenerated clock signals CK5 and CK7, the regenerated clock signals CK7 and CK9, the regenerated clock signals CK9 and CK1, and the regenerated clock signals CK1 and CK3) to the AND circuits 51a to 51e.

Further, the OR circuits 82a to 82e of the down signal generating circuits 34a to 34e are configured to supply logical sums of the regenerated clock signals having different cycles with each other by 1 UI (the regenerated clock signals CK4 and CK6, the regenerated clock signals CK6 and CK8, the regenerated clock signals CK8 and CK10, the regenerated clock signals CK10 and CK2, and the regenerated clock signals CK2 and CK4) to the AND circuits 52a to 52e.

In the second embodiment, the AND circuits 51a to 51e are configured to generate the logical conjunctions of the exclusive logical sum signals EX1, EX3, EX5, EX7, and EX9 and the logical sum signals supplied from the OR circuits 81a to 81e as the up signals UP1 to UP5. More specifically, the up signal generating circuits 33a to 33e are configured to generate the logical conjunction of the exclusive logical sum of the n-th one of the latch data signals and the (n+1)th one of the latch data signals and the logical sum of the (n+2)th one of the regenerated clock signals and the (n+4)th one of the regenerated clock signals as the up signals UP1 to UP5.

In the second embodiment, the AND circuits 52a to 52e are configured to generate the logical conjunctions of the exclusive logical sum signals EX2, EX4, EX6, EX8, and EX10 and the logical sum signals supplied from the OR circuits 82a to 82e as the down signals DN1 to DN5. More specifically, the down signal generating circuits 34a to 34e are configured to generate the logical conjunction of the exclusive logical sum of the (n+1)th one of the latch data signals and the (n+2)th one of the latch data signals and the logical sum of the (n+3)th one of the regenerated clock signals and the (n+5)th one of the regenerated clock signals as the down signals DN1 to DN5.

Figure 16:
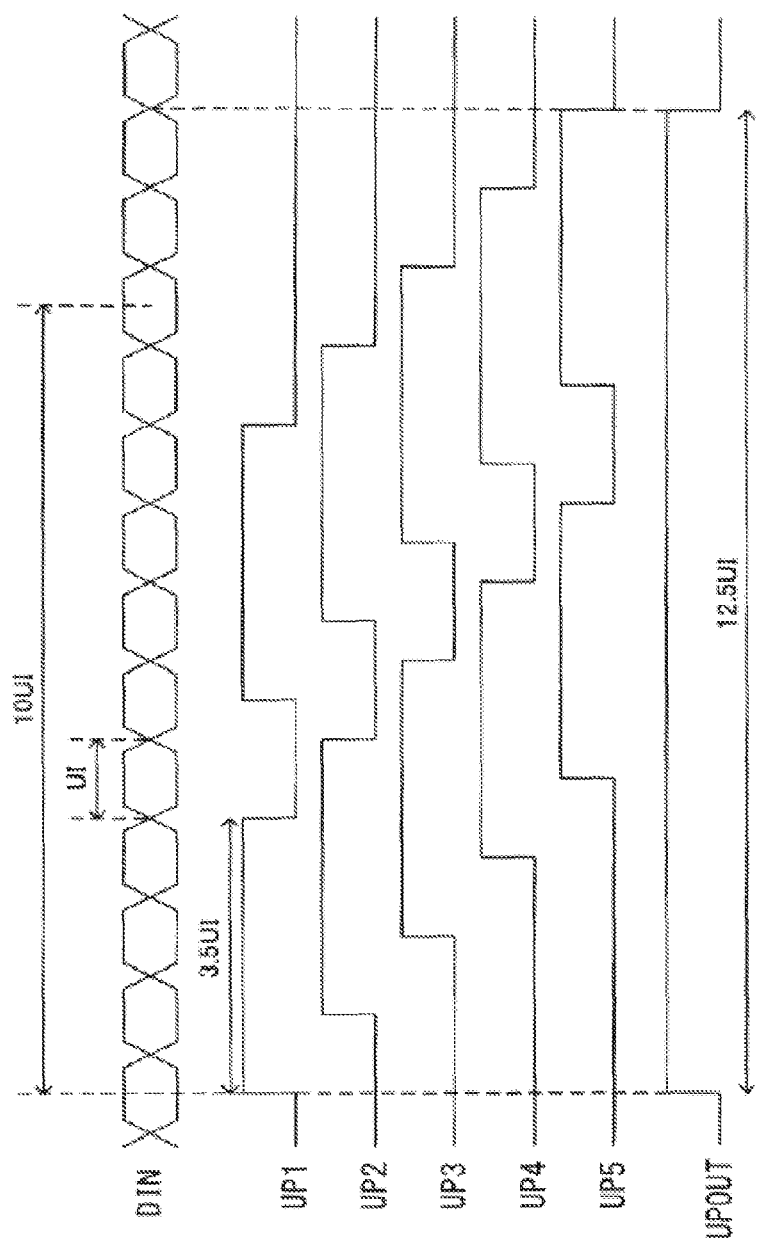
FIG. 16 is a time chart showing the charging operation of the clock data recovery circuit when the received data signal has the pattern in which the received data signal is transited ten times during the reference transition cycle 10 UI according to the second embodiment of the present invention.

Through the operation described above, in the second embodiment, the phase comparison circuit 14 generates the up signals UP1 to UP5 and the down signals DN1 to DN5, and supplies the up signals UP1 to UP5 and the down signals DN1 to DN5 to the charge ratio compression circuit 15. As described above, the regenerated clock signals CK1 to CK10 have the clock cycle of 5.0 UI, and the phases different with each other by 0.5 UI. Accordingly, the up signals UP1 to UP5 have the pulse width of 3.5 UI as shown in FIG. 16. Similarly, the down signals DN1 to DN5 have the pulse width of 3.5 UI.

A charging operation of the charge ratio compression circuit 15 and the charge pump 16 will be explained next. In the following description, the charging operation of the charge ratio compression circuit 15 and the charge pump 16 will be explained in the two separate cases when the received data signal DIN has the data pattern in which the received data signal DIN is transited ten times during the reference transition cycle 10 UI, and when the received data signal DIN has the data pattern in which the received data signal DIN is transited once during the reference transition cycle 10 UI.

FIG. 16 is a time chart showing the charging operation of the clock data recovery circuit 10 when the received data signal DIN has the pattern in which the received data signal DIN is transited ten times during the reference transition cycle 10 UI according to the second embodiment of the present invention.

As shown in FIG. 16, the up signals UP1 to UP5 output from the phase comparison circuit 14 have the pulse width of 2.5 UI, and have the phases different with each other by 1.0 UI.

In the second embodiment, as described above, the charge ratio compression circuit 15 outputs the logical sum of the up signals UP1 to UP5 as the up logical sum signal UPOUT. Accordingly, the up logical sum signal UPOUT has the pulse width of 12.5 UI. Further, the charge pump 16 charges the electrical charge amount of the product of the pulse width of the up logical sum signal UPOUT and the constant electrical current ICP (the please width 12.5 UI×ICP) to the line L1.

Figure 17:
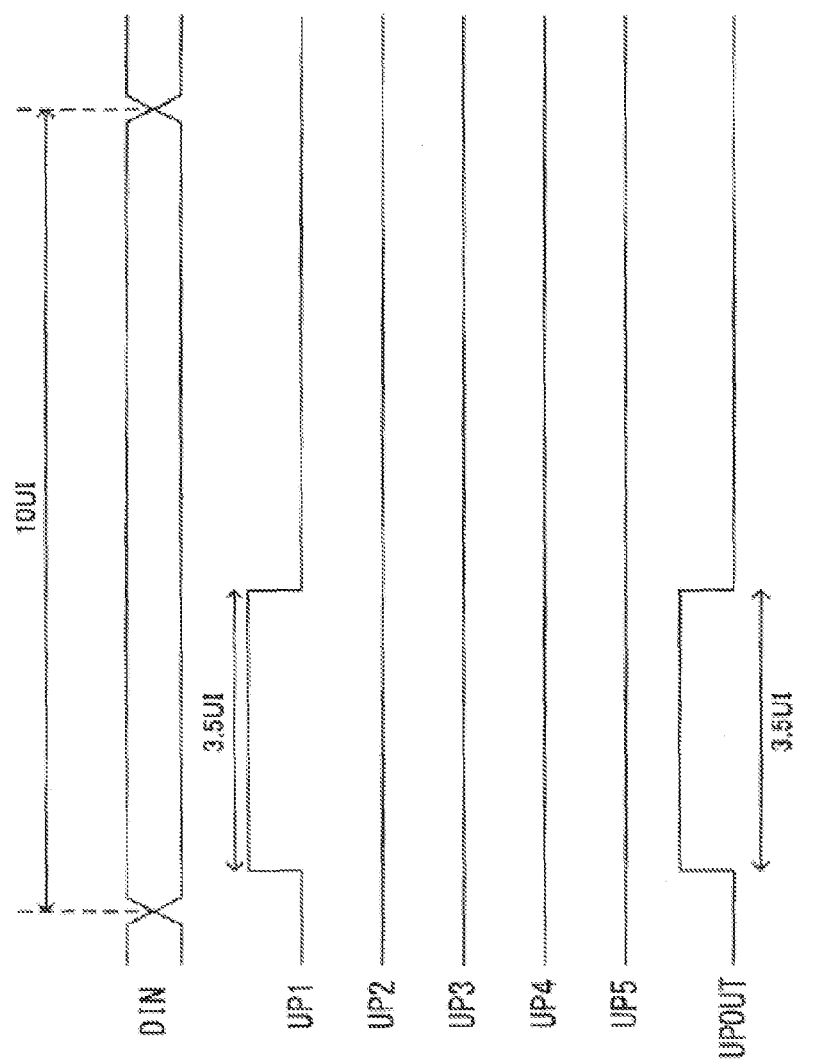
FIG. 17 is a time chart showing the charging operation of the clock data recovery circuit when the received data signal has a pattern in which the received data signal is transited one time during the reference transition cycle 10 UI according to the second embodiment of the present invention.

FIG. 17 is a time chart showing the charging operation of the clock data recovery circuit 10 when the received data signal DIN has the pattern in which the received data signal DIN is transited one time during the reference transition cycle 10 UI according to the second embodiment of the present invention.

As shown in FIG. 17, the up signal UP1 has the pulse width of 2.5 UI, and the up signals UP2 to UP5 have the logical level of zero (0).

In the first embodiment, as described above, the charge ratio compression circuit 15 outputs the logical sum of the up signals UP1 to UP5 as the up logical sum signal UPOUT having the pulse width of 3.5 UI. Accordingly, the charge pump 16 charges the electrical charge amount of the product of the pulse width of the up logical sum signal UPOUT and the constant electrical current ICP (the please width 3.5 UI×ICP) to the line L1.

As described above, the charge pump 16 charges the electrical charge amount at a ratio of about 3.57:1.0(12.5:2.5) between the two separate cases when the received data signal DIN is transited ten times during the reference transition cycle 10 UI, and when the received data signal DIN is transited once during the reference transition cycle 10 UI.

Accordingly, as compared with the clock data recovery circuit 10 in the first embodiment, it is possible to further minimize the difference in the electrical charge amount to be charged between the two separate cases when the transition frequency is maximum and when the transition frequency is minimum.

In the above description, the charging operation of the clock data recovery circuit 10 is explained. It should be noted that the discharging operation of the clock data recovery circuit 10 is similar to the charging operation of the clock data recovery circuit 10. More specifically, when the received data signal DIN has the data pattern in which the received data signal DIN is transited ten times during the reference transition cycle 10 UI, the charge pump 16 discharges the electrical charge amount of the product of the pulse width of the down logical sum signal DNOUT and the constant electrical current ICP (12.5 UI×ICP) to the line L1.

On the other hand, when the received data signal DIN has the data pattern in which the received data signal DIN is transited one time during the reference transition cycle 10 UI, the charge pump 16 discharges the electrical charge amount of the product of the pulse width of the down logical sum signal DNOUT and the constant electrical current ICP (the please width 3.5 UI×ICP) to the line L1. Accordingly, the charge pump 16 charges the electrical charge amount at a ratio of about 3.57:1(12.5:2.5) between the two separate cases when the received data signal DIN is transited ten times during the reference transition cycle 10 UI, and when the received data signal DIN is transited once during the reference transition cycle 10 UI.

As described above, in clock data recovery circuit 10 in the second embodiment, it is possible to minimize the difference in the electrical charge amounts to be charged or discharged with the charge pump 16 between the two separate cases when the transition frequency is maximum and when the transition frequency is minimum.

Accordingly, it is possible to improve follow ability of the clock relative to data when the data is transited less frequently whiling minimizing jitter of the clock when the data is transited to a large extent. Further, it is possible to minimize the number of insertion frequency of dummy bit through adjusting to prolong a period of time when the data is not transited. Accordingly, it is possible to realize the clock data recovery circuit with high data transmission efficiency.

In the first embodiment and the second embodiment, the data latch circuit 12 performs the parallel conversion of five bits relative to the received data signal DIN. It should be noted that the present invention is not limited to the bit number in the parallel conversion. For example, the data latch circuit 12 performs the parallel conversion of four bits, six bits, and the like.

In the first embodiment, the phase comparison circuit 14 has the configuration shown in FIG. 6. It should be noted that the configuration of the phase comparison circuit 14 is not limited thereto, and the phase comparison circuit 14 may be formed of a so-called phase comparison circuit of the Bang-Bang type using a delay flip flop (DFF).

In the first embodiment and the second embodiment, the regenerated clock signals CK1 to CK10 have the clock cycle of 5.0 UI, and the up signals UP1 to UP5 and the down signals DN1 to DN5 have the pulse width of 2.5 UI. It should be noted that the clock cycle and the pulse width are not limited thereto. The present invention may be applicable to the case that the up signals UP1 to UP5 and the down signals DN1 to DN5 have the pulse width greater than 1.0 UI.

More specifically, the charge ratio compression circuit 15 is configured to compress the charge amount of the charge pump 16 so that the pulse width of the up logical sum signal UPOUT as the logical sum of the up signals UP1 to UP5 becomes smaller than the sum of the pulse widths of the up signals UP1 to UP5. Similarly, the charge ratio compression circuit 15 is configured to compress the discharge amount of the charge pump 16 so that the pulse width of the down logical sum signal DNOUT as the logical sum of the down signals DN1 to DN5 becomes smaller than the sum of the pulse widths of the down signals DN1 to DN5.

In other words, in the first embodiment and the second embodiment, the clock data recovery circuit 10 receives the received data signal DIN formed of a series of the input data pieces synchronized with the reference clock signal, so that the clock data recovery circuit 10 generates the regenerated clock signals. Further, the VCO (Voltage Control Oscillator) 18 is configured to generate the regenerated clock signals CK1 to CK10 having the phases different with each other by a half of the cycle (UI) of the reference clock signal.

Further, in the first embodiment and the second embodiment, the data latch circuit 12 is configured to sequentially latch the input data signal DIN at the edge timing of the regenerated clock signals, so that the latch circuit 12 generates a plurality of the latch data signals DOUT1 to DOUT10. The comparison circuit 14 is configured to generate the up signals UP1 to UP5 having the pulse width greater than the cycle (UI) of the reference clock signal when the n-th one (n is a natural number) of the latch data signals is different from the (n+1)th one of the latch data signals among the latch data signals. Further, the comparison circuit 14 is configured to generate the down signals DN1 to DN5 having the pulse width greater than the cycle of the reference clock signal when the (n+1)th one of the latch data signals is different from the (n+2)th one of the latch data signals. Accordingly, the comparison circuit 14 is configured to generate a plurality of the up signals and a plurality of the down signals.

Further, in the first embodiment and the second embodiment, the logical sum signal generating circuit 15 is configured to generate the first logical sum signal UPOUT formed of the logical sum of the up signals and the second logical sum signal DNOUT formed of the logical sum of the down signals. The charge pump 16 is configured to charge electron charges according to the first logical sum signal UPOUT, and discharge the electron charges according to the second logical sum signal DNOUT, so that the charge pump 16 generates the phase control signal CTRL. Accordingly, the regenerated clock generating circuit 18 is configured to correct the phases of the regenerated clock signals according to the phase control voltage CTRL.

The disclosure of Japanese Patent Application No. 2014-251484, filed on Dec. 12, 2014, is incorporated in the application by reference.

While the invention has been explained with reference to the specific embodiments of the invention, the explanation is illustrative and the invention is limited only by the appended claims.

What is claimed is:

1. A clock data recovery circuit configured to receive an input data signal formed of a series of input data pieces synchronized with a reference clock signal, and to generate a regenerated clock signal, comprising:
    a regenerated clock generating circuit configured to generate a plurality of regenerated clock signals having phases different from each other by a half of a cycle of the reference clock signal;
    a latch circuit configured to sequentially latch the input data signal at an edge timing of the regenerated clock signals so that the latch circuit generates a plurality of latch data signals;
    a comparison circuit configured to generate an up signal having a pulse width greater than the cycle of the reference clock signal when n-th one (n is a natural number) of the latch data signals is different from (n+1)th one of the latch data signals among the latch data signals, said comparison circuit is configured to generate a down signal having a pulse width greater than the cycle of the reference clock signal when the (n+1)th one of the latch data signals is different from (n+2)th one of the latch data signals, said comparison circuit is configured to generate a plurality of up signals and a plurality of down signals;
    a logical sum signal generating circuit configured to generate a first logical sum signal formed of a logical sum of the up signals and a second logical sum signal formed of a logical sum of the down signals; and
    a charge pump configured to generate a phase control voltage through charging electron charges according to the first logical sum signal, and discharging the electron charges according to the second logical sum signal,
    wherein said regenerated clock generating circuit is configured to correct phases of the regenerated clock signals according to the phase control voltage.

2. The clock data recovery circuit according to claim 1, wherein said comparison circuit is configured to generate a logical conjunction of a first exclusive logical sum signal formed of exclusive logical sums of the n-th one of the latch data signals and the (n+1)th one of the latch data signals and one of the regenerated clock signals as the up signal, and
    said comparison circuit is configured to generate a logical conjunction of a second exclusive logical sum signal formed of exclusive logical sums of the (n+1)th one of the latch data signals and the (n+2)th one of the latch data signals and another one of the regenerated clock signals as the down signal.

3. The clock data recovery circuit according to claim 1, wherein said comparison circuit is configured to generate a logical conjunction of a first exclusive logical sum signal formed of exclusive logical sums of the n-th one of the latch data signals and the (n+1)th one of the latch data signals and two of the regenerated clock signals having a phase difference greater than the cycle of the reference clock signal as the up signal, and
    said comparison circuit is configured to generate a logical conjunction of a second exclusive logical sum signal formed of exclusive logical sums of the (n+1)th one of the latch data signals and the (n+2)th one of the latch data signals and another two of the regenerated clock signals having a phase difference greater than the cycle of the reference clock signal as the down signal.

4. The clock data recovery circuit according to claim 1, further comprising a reception circuit configured to amplify the series of the input data pieces synchronized with the reference clock signal, and to supply the series of the input data pieces to the latch circuit as the input data signal; and
    a low pass filter disposed between the charge pump and the regenerated clock generating circuit for filtering the phase control voltage and supplying the phase control voltage to the regenerated clock generating circuit.

5. A clock data recovery circuit comprising:
    a regenerated clock generating circuit configured to generate a plurality of regenerated clock signals having phases different from each other by a half of a cycle of a reference clock signal;
    a comparison circuit configured to generate a plurality of up signals when n-th one (n is a natural number) of data pieces is different from (n+1)th one of the data pieces among a series of the data pieces synchronized with the reference clock signal, said comparison circuit is configured to generate a plurality of down signals when the (n+1)th one of the data pieces is different from (n+2)th one of the data pieces;
    a logical sum signal generating circuit configured to generate a first logical sum signal formed of a logical sum of the up signals and a second logical sum signal formed of a logical sum of the down signals; and a charge pump configured to generate a phase control voltage through charging electron charges according to the first logical sum signal, and discharging the electron charges according to the second logical sum signal, wherein said regenerated clock generating circuit is configured to correct phases of the regenerated clock signals according to the phase control voltage.

6. The clock data recovery circuit according to claim 5, wherein said comparison circuit is configured to generate a logical conjunction of a first exclusive logical sum signal formed of exclusive logical sums of the n-th one of the data pieces and the (n+1)th one of the data pieces and one of the regenerated clock signals as the up signal, and said comparison circuit is configured to generate a logical conjunction of a second exclusive logical sum signal formed of exclusive logical sums of the (n+1)th one of the data pieces and the (n+2)th one of the data pieces and another one of the regenerated clock signals as the down signal.

7. The clock data recovery circuit according to claim 5, wherein said comparison circuit is configured to generate a logical conjunction of a first exclusive logical sum signal formed of exclusive logical sums of the n-th one of the data pieces and the (n+1)th one of the data pieces and two of the regenerated clock signals having a phase difference greater than the cycle of the reference clock signal as the up signal, and said comparison circuit is configured to generate a logical conjunction of a second exclusive logical sum signal formed of exclusive logical sums of the (n+1)th one of the data pieces and the (n+2)th one of the data pieces and another two of the regenerated clock signals having a phase difference greater than the cycle of the reference clock signal as the down signal.

8. The clock data recovery circuit according to claim 5, further comprising a low pass filter disposed between the charge pump and the regenerated clock generating circuit for filtering the phase control voltage and supplying the phase control voltage to the regenerated clock generating circuit.

9. A semiconductor device, comprising:
a clock data recovery circuit configured to receive an input data signal formed of a series of input data pieces synchronized with a reference clock signal, and to generate a regenerated clock signal, wherein said clock data recovery circuit comprises:
a regenerated clock generating circuit configured to generate a plurality of regenerated clock signals having phases different from each other by a half of a cycle of the reference clock signal;
a latch circuit configured to sequentially latch the input data signal at an edge timing of the regenerated clock signals so that the latch circuit generates a plurality of latch data signals;
a comparison circuit configured to generate an up signal having a pulse width greater than the cycle of the reference clock signal when n-th one (n is a natural number) of the latch data signals is different from (n+1)th one of the latch data signals among the latch data signals, said comparison circuit is configured to generate a down signal having a pulse width greater than the cycle of the reference clock signal when the (n+1)th one of the latch data signals is different from (n+2)th one of the latch data signals, said comparison circuit is configured to generate a plurality of up signals and a plurality of down signals;

a logical sum signal generating circuit configured to generate a first logical sum signal formed of a logical sum of the up signals and a second logical sum signal formed of a logical sum of the down signals; and a charge pump configured to generate a phase control voltage through charging electron charges according to the first logical sum signal, and discharging the electron charges according to the second logical sum signal, wherein said regenerated clock generating circuit is configured to correct phases of the regenerated clock signals according to the phase control voltage.

10. The semiconductor device according to claim 9, wherein said comparison circuit is configured to generate a logical conjunction of a first exclusive logical sum signal formed of exclusive logical sums of the n-th one of the latch data signals and the (n+1)th one of the latch data signals and one of the regenerated clock signals as the up signal, and said comparison circuit is configured to generate a logical conjunction of a second exclusive logical sum signal formed of exclusive logical sums of the (n+1)th one of the latch data signals and the (n+2)th one of the latch data signals and another one of the regenerated clock signals as the down signal.

11. The semiconductor device according to claim 9, wherein said comparison circuit is configured to generate a logical conjunction of a first exclusive logical sum signal formed of exclusive logical sums of the n-th one of the latch data signals and the (n+1)th one of the latch data signals and two of the regenerated clock signals having a phase difference greater than the cycle of the reference clock signal as the up signal, and said comparison circuit is configured to generate a logical conjunction of a second exclusive logical sum signal formed of exclusive logical sums of the (n+1)th one of the latch data signals and the (n+2)th one of the latch data signals and another two of the regenerated clock signals having a phase difference greater than the cycle of the reference clock signal as the down signal.

12. The semiconductor device according to claim 9, further comprising a reception circuit configured to amplify the series of the input data pieces synchronized with the reference clock signal, and to supply the series of the input data pieces to the latch circuit as the input data signal; and a low pass filter disposed between the charge pump and the regenerated clock generating circuit for filtering the phase control voltage and supplying the phase control voltage to the regenerated clock generating circuit.

* * * * *